US006670213B2

(12) United States Patent
Halls et al.

(10) Patent No.: US 6,670,213 B2
(45) Date of Patent: Dec. 30, 2003

(54) METHOD OF PREPARING PHOTORESPONSIVE DEVICES, AND DEVICES MADE THEREBY

(75) Inventors: Jonathan J. Halls, Cambridge (GB); Richard H. Friend, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 09/974,018

(22) Filed: Oct. 10, 2001

(65) Prior Publication Data

US 2003/0066950 A1 Apr. 10, 2003

(51) Int. Cl.[7] .......................... H01L 21/00; H01L 51/44
(52) U.S. Cl. ............................ 438/52; 438/57; 438/82; 438/87; 438/99
(58) Field of Search ....................... 438/52, 57, 82, 438/87, 89, 99; 257/40, 443, 448, 457, 459, 99, 103

(56) References Cited

U.S. PATENT DOCUMENTS

| 3,883,688 A |   | 5/1975  | Greis et al. ............. 178/6.7 R |
|-------------|---|---------|-------------------------------------|
| 5,523,555 A |   | 6/1996  | Friend et al. ........... 250/214 R  |
| 5,670,791 A |   | 9/1997  | Halls et al. ................. 257/40 |
| 5,698,048 A | * | 12/1997 | Friend et al. ............... 136/263 |
| 5,729,379 A | * | 3/1998  | Allemand et al. .......... 359/270   |
| 5,798,170 A | * | 8/1998  | Zhang et al. .............. 428/212   |
| 5,804,836 A | * | 9/1998  | Heeger et al. .............. 257/40   |
| 5,955,834 A | * | 9/1999  | Epstein et al. ............. 313/501  |
| 6,284,435 B1 | * | 9/2001  | Cao ........................... 430/319 |
| 6,340,789 B1 | * | 1/2002  | Petritsch et al. ........... 136/263  |

FOREIGN PATENT DOCUMENTS

| GB | 2315594      | 2/1998  |
|----|--------------|---------|
| WO | WO 97/42666  | 11/1997 |
| WO | WO 99/09603  | 2/1999  |
| WO | WO 99/49525  | 9/1999  |
| WO | WO 01/49768  | 7/2001  |

OTHER PUBLICATIONS

"Broad Spectral Sensitization of Organic Photovoltaic Heterojunction Device by Perylene and $C_{60}$", Feng et al., Journal of Applied Physics, vol. 88 (12), Dec. 15, 2000, pp. 7120–7123.

"Crystal Network Formation in Organic Solar Cells", Dittmer et al., Solar Energy Materials and Solar Cells, 61, 2000, pp. 53–61.

* cited by examiner

Primary Examiner—Michael S. Lebentritt
(74) Attorney, Agent, or Firm—Marshall, Gerstein & Borun LLP

(57) ABSTRACT

A method of preparing an efficient photoresponsive device includes the steps of providing a first electrode on a substrate, providing a layer of an organic material including a blend of at least two semiconductive polymers having different electrode affinities and/or different ionization potentials over the first electrode, providing a second electrode over the layer of organic material, at least one of the electrodes being a transparent or semi-transparent, to form a photoresponsive device, and thermally annealing the photoresponsive device.

25 Claims, 3 Drawing Sheets

Poly(2-methoxy-5-(2'-ethyl)hexyloxy
-p-phenylenevinylene)

Poly(3-hexyl)thiophene

Poly(2,7-(9,9-di-n-octylfluorene))

Poly(2,7-(9,9-di-n-octylfluorene)
-benzothiadiazole)

Poly(2,7-(9,9-di-n-octylfluorene)
-(4,7-di-2-thienyl-(benzothiadiazole))

METHOD OF PREPARING PHOTORESPONSIVE DEVICES, AND DEVICES MADE THEREBY

FIELD OF THE INVENTION

The invention relates to a method of preparing efficient photoresponsive devices and to devices such as photovoltaic devices and photodetectors prepared by this method.

BACKGROUND OF THE INVENTION

Photoresponsive devices based on semiconductive polymers have been investigated for a number of years, examples of such devices can be found in WO 99/09603, GB 2,315, 594, U.S. Pat. Nos. 5,523,555, and 5,670,791. In these disclosures polymer photoresponsive devices include an active polymer layer or layers situated between two electrodes. Where the two electrodes have different work functions a built-in, internal field is generated across the active polymer layer giving rise to a photovoltaic effect, such devices are termed photovoltaic cells. A device of this construction will also have rectifying properties so may also be termed a photodiode. Photoresponsive devices have application as solar cells which generate electricity from light and as photodetectors which measure or detect light.

Photovoltaic devices such as that described in U.S. Pat. No. 5,670,791 have a construction in which a layer comprising a blend of two semiconductive polymers having different electron affinities and/or ionization potentials is situated between two electrodes of different work function, FIG. 1 shows such a device having a transparent glass substrate (1), a transparent anode (2), a hole transport layer (3), a layer comprising a blend of two semiconductive polymers forming an interpenetrating network (4) and a metallic cathode (5). The electrodes of different work function set up an internal electric field across the device. Such devices operate on the principle that absorption of light by the polymers of the organic layer generates bound electron-hole pairs, termed excitons. Excitons generated on the polymer of lower electron affinity dissociate by transfer of an electron to the polymer of higher electron affinity, the polymer of lower electron affinity is sometimes referred to as the electron donor or simply donor. Excitons generated on the polymer of higher electron affinity dissociate by transfer of a hole to the polymer of lower electron affinity, the polymer of higher electron affinity is sometimes referred to as the electron acceptor or simply acceptor. The electrons and holes generated by dissociation of the excitons then move through the device, with electrons moving to the lower work function cathode and holes moving to the higher work function anode. This is shown in FIG. 2(a) which shows a photovoltaic device having an interpenetrating network of two semiconductive polymeric materials one of which has a higher electron affinity (41) than the other (42), FIG. 2(b) shows schematically an exciton (43) generated by an incident photon being split into an electron (44) and a hole (45), the electron moving through the polymer of higher electron affinity (41) and the hole moving through the polymer of lower electron affinity (42). In this way light incident on the device generates a current which may be used in an external circuit. Photoresponsive devices may also be constructed in which the electrodes are of the same work function and an external bias is applied across the device to fulfill the function of the above described internal bias.

Increasing the efficiency of photovoltaic devices is a primary concern in the solar cell industry. At present photovoltaic cells based on organic materials are characterised by low power conversion efficiencies and low external quantum efficiencies. The power conversion efficiency is the ratio of the power taken out of the device in the form of electricity to the power put into the device in the form of incident light. The external quantum efficiency is the ratio of electrons collected from a device to the number of photons incident on the device, this is also known as the quantum yield.

In WO 99/49525 a method for increasing the efficiency of a photovoltaic device is disclosed in which a component having an electrode and a layer of a semiconductive polymer which acts as an electron donor and component having an electrode and a layer of a semiconductive polymer which acts as an electron acceptor are laminated together in such a manner so as to form a device with a layer comprising a mixture of the two semiconductive polymers at the interface where the two components are laminated together. A device prepared in this way was found to have higher efficiency than a device prepared from a blend of two semiconductive polymers, such as the device disclosed in the aforementioned U.S. Pat. No. 5,670,791.

It has been observed in photovoltaic devices having a double layer structure in which the layers comprise the semiconductive polymer poly(3-dodecylthiophene) and the semiconductive molecule N,N'-diphenylglyoxaline-3,4,9,10-perylene tetracarboxylic acid diacidamide or a mixture of the two, that annealing the double-layer structure device leads to improvements in device efficiency, see Feng et al, *Journal of Applied Physics*, 88 (12), 2000, 7120–7123.

Similarly a photovoltaic device comprising a blend of poly(phenylenevinylene) and a perylene derivative has been prepared, annealing the device was shown to increase the external quantum efficiency of the device, see Dittmer et al, *Solar Energy Materials and Solar Cells*, 61, (2000), 53–61.

SUMMARY OF THE INVENTION

The invention provides a method for greatly improving the power conversion efficiency of photovoltaic devices having a single layer of a blend of semiconductive polymers. The method employed has significant processing advantages in that it does not involve complex lamination steps and since it uses only polymeric materials the present invention has advantages over devices which include small molecule electron donors and/or acceptors in that the devices can be readily prepared by solution processing techniques such as spin coating. Further the annealing step is carried out after the layer of active polymeric material has been positioned between the two electrodes such that the electrodes to some degree prevent degradation of the polymeric material which may occur on annealing. The invention allows access to a wide range of photovoltaic devices of improved performance.

In a first embodiment, the invention provides a method of preparing an efficient photoresponsive device comprising the steps of forming a photoresponsive device by providing a first electrode on a substrate, providing a layer of organic material over said first electrode comprising a blend of at least two semiconductive polymers, the semiconductive polymers having different electron affinities and/or different ionization potentials, and providing a second electrode over the layer of organic material, wherein at least one of said electrodes is transparent or semi-transparent, and carrying out a further step in which the photoresponsive device is thermally annealed.

The semiconductive polymers used in devices according to the invention are preferably selected from the group of polymers and copolymers consisting of polyfluorenes, polybenzothiazoles, polytriarylamines, poly (phenylenevinylenes), polyphenylenes, polythiophenes, polypyrroles, polyacetylenes, polyisonaphthalenes and polyquinolines. The polymers and copolymers polyfluorene, polybenzothiazole, polytriarylamine, poly (phenylenevinylene), and polythiophene are preferred.

In a preferred embodiment, photoresponsive devices prepared by the method of the invention include at least one semiconductive polymer selected from the group consisting of polyfluorene and poly(phenylenevinylene) and at least one alkyl substituted polythiophene.

Particularly preferred polymers include polyphenylenevinylenes such as MEH-PPV (poly(2-methoxy, 5-(2'-ethyl) hexyloxy-p-phenylenevinylene)), MEH-CN-PPV (poly(2,5-bis(nitrilemethyl)-1-methoxy-4-(2'-ethyl-hexyloxy) benzene-co-2,5-dialdehyde-I-methoxy4-(2'-ethylhexyloxy) benzene)) and CN-PPV (cyano substituted PPV), polyalkylthiophenes, such as poly(3-hexylthiophene) and poly(3-dodecylthiophene), polyfluorenes, such as poly(2,7-(9,9-di-n-o-ctylfluorene), poly(2,7-(9,9-di-n-octylfluorene)-benzothiadiazole) and poly(2,7-(9,9-di-n-octylfluorene)-(4,7-di-2-thienyl-(benzothiazole)) and related polybenzothiazoles such as are disclosed in WO 01/49768. Examples of some of these polymers are shown in FIG. 3.

The method of the invention is applicable to photoresponsive devices comprising a blend of at least two semiconductive polymers, said semiconductive polymers having different electron affinities and/or different ionization potentials, the organic layer of the photoresponsive devices may comprise further organic and or inorganic species such as further semiconductive polymers or charge transport components. In a preferred embodiment the blend of semiconductive polymers of method of the invention comprises two semiconductive polymers, preferably in a ratio of 1:1.

The thermal annealing of the photoresponsive devices may be carried out at any suitable temperature, suitable temperatures may be readily determined by the person skilled in the art. It is preferred that the thermal annealing is carried out by heating said device at a temperature between 60° C. and 220° C., preferably between 100° C. and 180° C. The thermal annealing may be carried out for a period of from 10 minutes to several days, although preferably annealing is performed for between 30 minutes and 12 hours. The annealing time has been found to have little effect on the resultant improvement in device efficiency.

Although not essential to the performance of the invention it is preferred that said first electrode of the photoresponsive device comprises a material of high work function and said second electrode of the photoresponsive device comprises a material of low work function. Preferred high work function materials include indium-tin oxide, tin oxide, indium-doped zinc oxide, aluminum-doped zinc oxide, magnesium-indium oxide, cadmium-tin oxide, Au, Ag, Ni, Pd and Pt. Preferred low work function materials include Li, Na, K, Rb, Be, Mg, Ca, Sr, Ba, Yb, Sm, Al, and alloys comprising the aforementioned low work function materials. A layer of dielectric material may be disposed between said second electrode and said layer of organic material; preferably, this dielectric material is selected from oxides or halides of alkali metals or alkaline earth metals; fluorides of alkali metals or alkaline earth metals are preferred.

The substrate on which the first electrode of the photoresponsive device prepared according to the inventive method is deposited is preferably selected from the group of materials consisting of glass, acrylic resins, polycarbonate resins, polyester resins, and polyethylene terephthalate resins.

The method of the invention may also involve providing further layers in said photoresponsive device such as charge transporting and/or charge injecting layers, preferably a hole transporting layer is provided between said first electrode and the layer of organic material; the hole transport material is preferably poly(ethylenedioxythiophene):polystyrene sulfonic acid (PEDOT:PSS)

In a further embodiment, the invention provides a photoresponsive device obtained by the method of the invention. The photoresponsive device is preferably a photovoltaic device or a photodetector. Where said photoresponsive device is a photodetector, the device further comprises external means for measuring the current flowing across the device and for converting this into a signal.

The invention further provides a method of increasing power conversion efficiency and/or quantum yield in a photoresponsive device through the use of thermal annealing, whereby a photoresponsive device comprising a layer of organic material comprising a blend of at least two semiconductive polymers, the semiconductive polymers having different electron affinities and/or ionization potentials is thermally annealed.

DETAILED DESCRIPTION OF THE PREFERRED EMBODIMENTS

Figure 1:
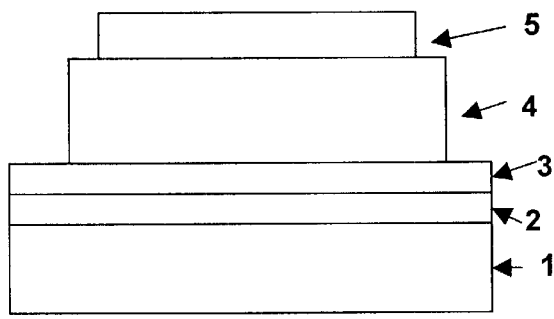
FIG. 1 shows the structure of a typical photovoltaic device.
Figure 2:
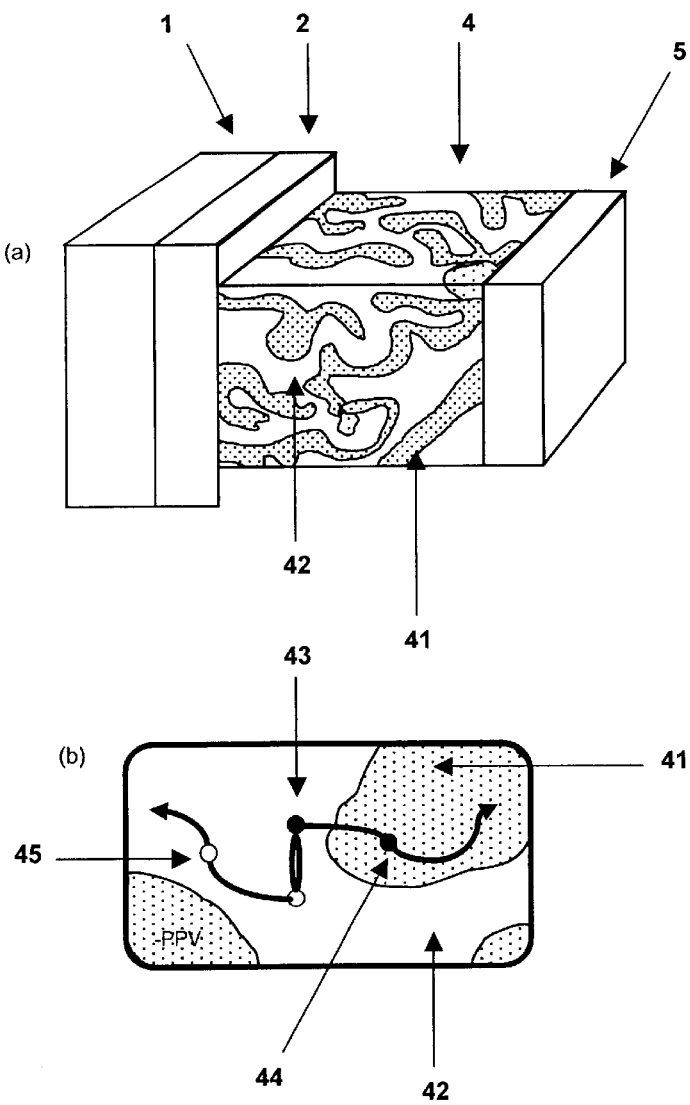
FIG. 2(a) schematically shows a photovoltaic device having an interpenetrating polymer network.
FIG. 2(b) schematically illustrates the splitting of an exciton into an electron and a hole and their movement through the polymers of the device.

A photoresponsive device is illustrated in FIG. 1 and comprises a first electrode (1), in this case the anode, formed by a layer of conducting material on a substrate (2), a layer comprising a blend of two semiconductive polymers (4) and a second electrode (5), the cathode. There may be other layers present in the device to improve charge injection or charge transport, for example a layer of hole-transporting material may be provided between the anode and the layer of semiconductive polymers, such a layer (3) is shown in FIG. 1.

The anode of the device preferably comprises a material of high work function deposited on a substrate. Preferably the material has a work function greater than 4.3 eV, examples of such materials include indium-tin oxide (ITO), tin oxide (TO), aluminum- or indium-doped zinc oxide, magnesium-indium oxide, cadmium tin-oxide and metals such as Au, Ag, Ni, Pd, and Pt. Suitable substrates include glass and plastics such as acrylic resins, polycarbonate resins, polyester resins, and polyethylene terephthalate resins. The substrate may be rigid or flexible, transparent or opaque. At least one of the electrodes must be transparent or semi-transparent to incident light, in cases where the anode is opaque the cathode is transparent. The material of high work function is suitably deposited on the substrate to form a film of 50 nm to 200 nm. Preferably, the film has a sheet resistance of 10–100 Ohm/square, more preferably less than 30 Ohm/square.

The cathode of the device is preferably a material of low work function, preferably of work function less than 3.5 eV. Examples of such materials include Li, Na, K, Rb, Be, Mg, Ca, Sr, Ba, Yb, Sm and Al. The cathode may comprise an alloy of such metals or an alloy of such metals in combination with other metals, for example the alloys MgAg and LiAl. The cathode may be transparent or opaque, where the cathode is opaque the anode is transparent. The cathode preferably comprises multiple layers, for example Ca/Al or LiAl/Al. The device may further comprise a layer of dielectric material between the cathode and the photoresponsive layer, such as is disclosed in WO 97/42666. In particular it is preferred to use an alkali or alkaline earth metal fluoride as a dielectric layer between the cathode and the photoresponsive material, LiF is particularly preferred.

Any semiconductive polymers may be used in photovoltaic devices of the invention. In particular, the polymers and copolymers of polyfluorenes, polybenzothiazoles, polytriarylamines, poly(phenylenevinylenes), polyphenylenes, polythiophenes, polypyrroles, polyacetylenes, polyisonaphthalenes, polyquinolines and polymers comprising perylene units are considered to be particularly useful. The polymers and copolymers polyfluorene, polybenzothiazole, polytriarylamine, poly(phenylenevinylene), and polythiophene are preferred.

It is essential that polymers having different electron affinities and/or ionization potentials are selected in order to provide the driving force for the separation of excitons generated by incident photons into electrons and holes and to enable the electrons and holes so generated to move to the electrodes. In order to select polymers with suitable electron affinities and ionization potentials these values may be readily determined by techniques such as cyclic voltammetry and computer modeling. The terms "electron donor" and "electron acceptor" are also used in the art in describing materials for use in photoresponsive devices, with electron donor referring to materials having a low electron affinity and/or a low ionization potential and electron acceptor referring to materials having a high electron affinity and/or a high ionization potential.

The active layer of the photoresponsive device may contain further materials such as further semiconductive polymers or materials to aid charge transport in the device which may also be semiconductive polymers.

Figure 3:
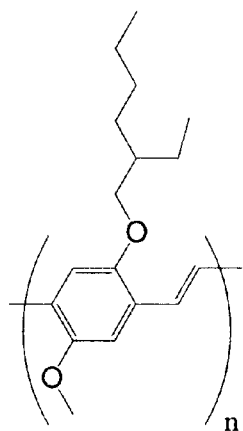
FIG. 3 shows polymers which may be used in the devices of the invention, wherein n, x, and y represent the proportion or distribution of monomers in the polymer.
Figure 3:
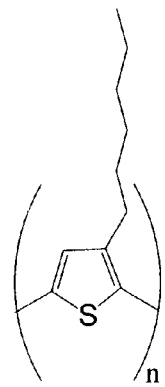
Figure 3:
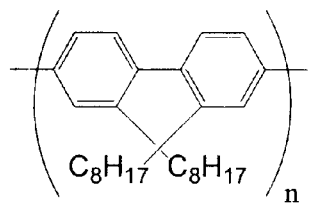
Figure 3:
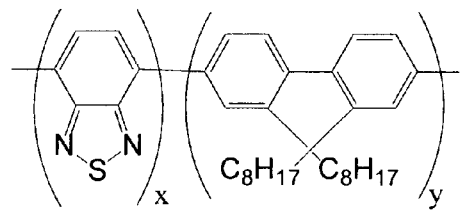
Figure 3:
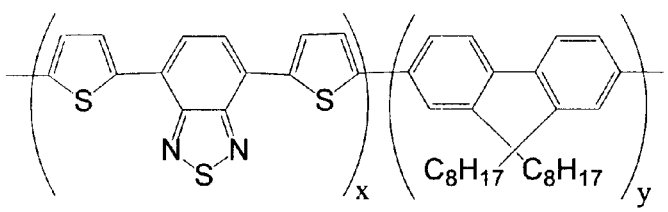

Particularly preferred polymers are shown in FIG. 3, wherein n, x, and y represent the proportion, or distribution of monomers in the polymer, and include polyphenylenevinylenes such as MEH-PPV (poly(2-methoxy, 5-(2'-ethyl) hexyloxy-p-phenylenevinylene)), MEH-CN-PPV (poly(2,5-bis(nitrilemethyl)-1-methoxy-4-(2'-ethyl-hexyloxy) benzene-co-2,5-dialdehyde-I-methoxy4-(2'-ethylhexyloxy) benzene)) and CN-PPV (cyano substituted PPV), polyalkylthiophenes, such as poly(3-hexylthiophene) and poly(3-dodecylthiophene), polyfluorenes, such as poly(2,7-(9,9-di-n-octylfluorene), poly(2,7-(9,9-di-n-octylfluorene)-benzothiadiazole) and poly(2,7(9,9-di-n-octylfluorene)-(4,7-di-2-thienyl-(benzothiazole)) and related polybenzothiazoles such as are disclosed in WO 01/49768.

Where the photoresponsive device comprises further charge injecting or charge transporting materials these further materials may be present as separate layers. Examples of suitable charge transporting materials include polystyrene sulfonic acid doped polyethylene dioxythiophene (PEDOT-PSS), polyaniline with anionic dopants such as polymeric anionic dopants, and triarylamines, including polymeric triarylamines such as poly(2,7-(9,9ni-n-octylfluorene)-(1,4-phenylene-(4-imino(benzoic acid))-1,4-phenylene-(4-imino (benzoic acid))-1,4-phenylene)) BFA. The charge transport or charge injecting layers suitably have a thickness in the range 10 nm to 200 nm, preferably 1 nm to 50 nm. The polymer blend PEDOT-PSS is a particularly preferred hole transporting material which improves device performance when positioned between the anode and the photoresponsive material.

A photoresponsive device according to the invention is typically prepared by first depositing a layer of high work function material onto a suitable substrate to form the anode, the layer of high work function material may be deposited by any suitable method, such as sputtering or solution processing. If required a layer of charge-transporting material is then deposited over the anode, charge-transporting materials such as PEDOT-PSS may be deposited by any suitable method such as spin coating, doctor blade coating, roll coating, ink-jet printing, screen printing and the like.

A blend of at least two semiconductive polymers is then prepared, typically a solution of the semiconductive polymers in a suitable solvent is prepared and agitated and/or heated so as to obtain a thorough mixture. A suitable solvent is one in which the semiconductive polymers are soluble, examples of suitable solvents include, chloroform, dichloromethane, toluene, xylene, methanol and mixtures of these solvents. Clearly the choice of solvent depends on the particular polymer system being investigated and could be readily determined by one skilled in the art. The solution comprising the semiconductive polymers is then deposited over the anode, or if present over the charge-transporting layer. The solution comprising the semiconductive polymers may be deposited by any suitable method such as spin coating, doctor blade coating, roll coating, ink-jet printing, screen printing and the like.

If required further charge transporting and/or charge injecting layers may then be deposited onto the layer comprising the blend of semiconductive polymers. The cathode is then deposited by any suitable technique, such as sputtering or thermal evaporation. When a dielectric layer is required between the cathode and the layer of photoresponsive material this may also be deposited by any suitable technique, such as sputtering or thermal evaporation.

The device may then be encapsulated to prevent the ingress of oxygen and moisture which are believed to have a deleterious effect on device performance. Encapsulation may be achieved by providing an impermeable substrate, such as glass or metal, over the cathode and sealing the edges of the device with a resin such as an epoxy resin. A drying agent and/or oxygen absorbent may be included in the encapsulated device to ensure the removal of water and/or oxygen.

For the purpose of the invention it is required that the device undergoes an annealing treatment. This is carried out after deposition of the second electrode, which is generally the cathode. If the device is encapsulated annealing may be carried out after encapsulation of the device. Experiments have shown little difference in device performance if annealing is carried out before or after encapsulation. Annealing is carried out by any suitable means by which the device is heated, such as placing the device in an oven, laser annealing, heating the device with IR radiation. Preferably heating is carried out in an inert atmosphere such as in a vacuum oven. Annealing may be carried out at any suitable temperature, suitable temperatures could be readily determined by one skilled in the art. It has been found that annealing temperatures ranging from 60° C. to 220° C. give a considerable improvement in device efficiency, with annealing at temperatures in the range 100° C. to 180° C. providing more improved device performance. In some systems annealing at 140° C. is sufficient to give greatly improved device performance. Annealing may be carried out for any period of time, the annealing may be carried out for a time period as short as 10 minutes to a time period of several days, the time period over which annealing is carried out has not been observed to affect the improvement to device performance to any significant extent.

The effect of the annealing step of the invention is to greatly improve device efficiency, improvements of up to a factor of 20 in external quantum yield have been observed in annealed devices in comparison to equivalent unannealed devices. Without wishing to be bound by theory the improvement in device performance obtained on annealing is considered to be due to the following mechanism. During the spin-coating process the extent of phase separation from the well mixed state which exists in the solution is limited by the short evaporation time of the volatile solvent. When the solvent has fully evaporated further rearrangement is impossible and the morphology of the blend is locked in place. Thermally annealing the device allows one or both of the polymers to physically re-arrange from the state that exists after completion of the spin-coating process to adopt a state with a lower free energy. In this way molecular alignment and overlap is enhanced leading to improved orbital overlap and increased mobility. In particular, certain polythiophenes, including the poly(3-hexylthiophene) used here, are known to aggregate on annealing, leading to the formation of ordered regions in which charge transport is facilitated. The aggregation of one or both of the polymers in the blend therefore allows improved transport of charges to the contacts, reducing the probability of recombination before the charges are extracted. The aggregation of one or more of the polymers provides a driving force for the exclusion of islands of material that do not form part of the connected network, and therefore act as charge traps. This increases the probability that charges resulting from the dissociation of excitons at the dispersed interfaces in the blend will be collected and extracted, increasing the quantum yield and charge collection efficiency.

The discussion of photoresponsive devices above refers in particular to photovoltaic devices, other devices comprising the same device architecture and operating according to the same mechanism can be readily envisaged. For example a photodetector could be prepared wherein the photoresponsive device is provided with an external means, such as a circuit, to measure the current generated across the device and convert this into a signal, which may be visual or another type of signal. An external bias may be provided across the electrodes of a photoresponsive device when used as a photodetector to improve the sensitivity and speed of response of the device.

EXAMPLE

A photovoltaic device according to an embodiment of the invention was prepared as follows. An ITO-coated glass substrate was cleaned using etch resist-stripper and subsequently de-ionized water in an ultrasonic bath. The substrate was exposed to an oxygen-plasma etch process to further clean the ITO. A solution of PEDOT-PSS (Baytron-P, obtained from Bayer) was mixed with PSS (polystyrene sulphonic acid) and water in a ratio 20:1.45:5. This solution was filtered through a 0.45 micron filter, and deposited by spin-coating onto the ITO-coated glass substrate. The spun-film of PEDOT-PSS was baked at 200° C. for one hour under continuous nitrogen flow. Solutions of poly(3-hexylthiophene) and poly(2,7-(9,9-di-n-octylfluorene)-(4,7-di-2-thienyl-(benzothiazole)) were made of concentration 15 mg/ml in anhydrous chloroform. The solutions were heated to 80° C. and agitated to assist the dissolving process. Solutions were prepared under protective nitrogen atmosphere. The solutions were mixed together in equal quantities. The solution was deposited by spin-coating at 3000 rpm at room temperature onto the PEDOT-PSS coated substrate under protective nitrogen atmosphere. The coated substrate was transferred to a vacuum chamber in which aluminum was thermally deposited onto the polymer surface. A shadow mask defined the shape of the deposited metal electrodes. The device was transferred to a vacuum oven, and annealed at 140° C. for 12 hours. The device was encapsulated by placing a small quantity of epoxy resin onto the aluminum-side of the device, and placing a glass slide on top.

Figure 4:
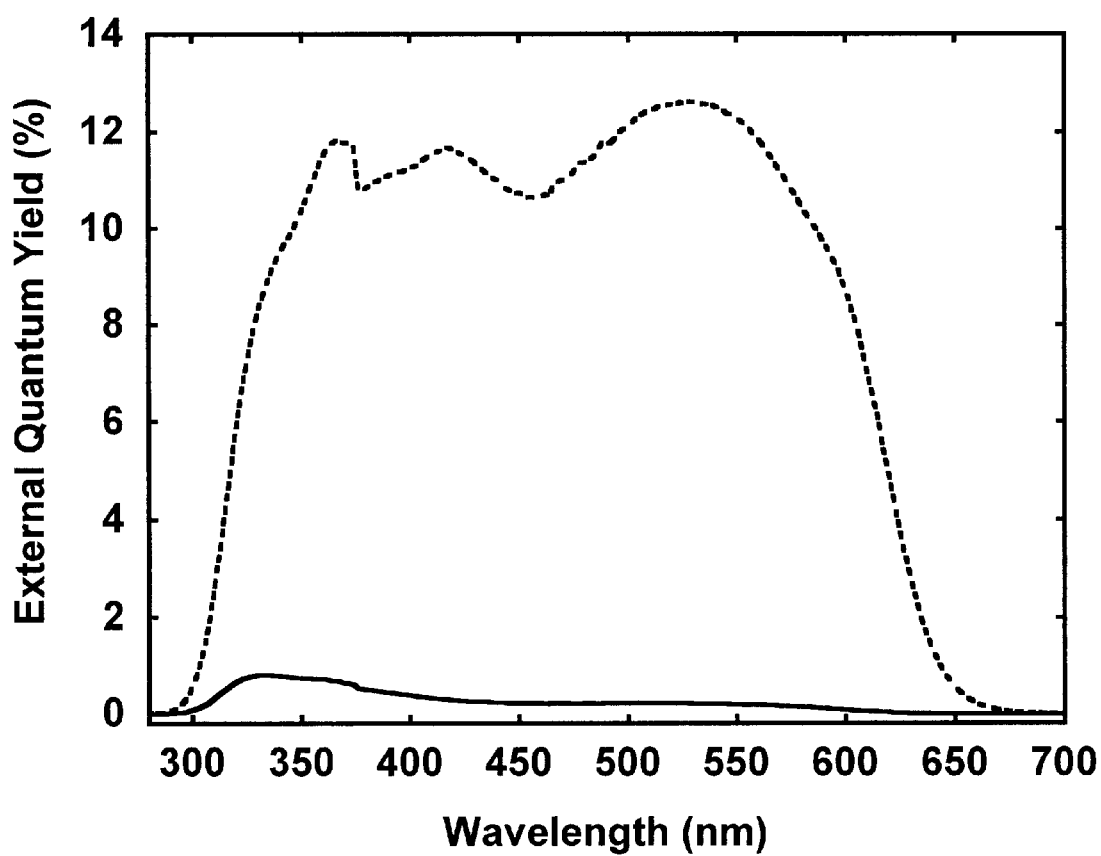
FIG. 4 is a graph of external quantum yield against wavelength of incident light (nm) for device measured before and after annealing

The annealing process has a marked effect on the device characteristics. FIG. 4 shows the photocurrent action spectra of cells measured under short-circuit conditions. Devices were illuminated using a xenon lamp coupled to a monochromator, and calibrated using a silicon photodiode of known efficiency. FIG. 4 shows that annealing (dashed line) gives a factor of 20 improvement in device performance over a device prepared in an identical manner which was not annealed (continuous line).

Experiments were carried out to determine the effect of annealing the device at different stages during its manufacture on the efficiency of the final device. Devices were annealed after deposition of the metal cathode or after encapsulation. It was determined that annealing after encapsulation leads to a small increase in device performance.

Devices were prepared according to the above example but in which the composition of the photoresponsive layer was varied to determine how the external quantum efficiency varies with blend composition, the highest efficiency was obtained for devices comprising a 50/50 blend of the two polymers. Experiments were also carried out to investigate the effect of the annealing temperature on device performance, for the device under investigation it was determined that the annealing temperature has an effect on device performance although even at very high and very low annealing temperatures significant improvement in performance is observed.

The invention teaches that significant improvements in the efficiency of photoresponsive devices comprising blends of semiconductive polymers can be obtained by annealing these devices and thereby makes readily available a range of efficient photoresponsive devices. Although the invention has been described in connection with specific exemplary embodiments, it should be understood that various changes, substitutions and alterations can be made to the disclosed embodiments without departing from the spirit and scope of the invention as set forth in the appended claims.

We claim:
1. A method of preparing an efficient photoresponsive device comprising
 (a) forming a photoresponsive device by
  (i) providing a first electrode on a substrate,
  (ii) depositing a single layer of organic material comprising a blend of at least two semiconductive polymers over said first electrode, said semiconductive polymers having different electron affinities and/or different ionization potentials, wherein only one layer of organic material comprising a blend of at least two semiconductive polymers is deposited, (iii) providing a second electrode over said layer of organic material, wherein at least one of said electrodes is transparent or semi-transparent, and (b) thermally annealing said photoresponsive device.

2. Method according to claim 1 wherein said semiconductive polymers are selected from the group of polymers and copolymers consisting of polyfluorenes, polybenzothiazoles, polytriarylamines, poly (phenylenevinylenes), polyphenylenes, polythiophenes, polypyrroles, polyacetylenes, polyisonaphthalenes, and polyquinolines.

3. Method according to claim 2 wherein said semiconductive polymers are selected from the group of polymers and copolymers consisting of polyfluorenes, polybenzothiazoles, polytriarylamines, poly (phenylenevinylenes) and polythiophenes.

4. Method according to claim 1 wherein at least one of said semiconductive polymers is selected from the group consisting of polyfluorenes, and poly(phenylenevinylenes), and at least one of said semiconductive polymers is an alkyl-substituted polythiophene.

5. Method according to claim 1 wherein said blend comprises two semiconductive polymers.

6. Method according to claim 5 wherein said blend comprises two semiconductive polymers in a ratio of 1:1.

7. Method according to claim 1 wherein said step of thermally annealing said photoresponsive device comprises heating said device at a temperature between 60° C. and 220° C.

8. Method according to claim 7 wherein said step of thermally annealing said photoresponsive device comprises heating said device at a temperature between 100° C. and 180° C.

9. Method according to claim 1 wherein said first electrode comprises a material of high work function and said second electrode comprises a material of low work function.

10. Method according to claim 9 wherein said first electrode is selected from the group of high work function materials consisting of indium-tin oxide, tin oxide, indium-doped zinc oxide, aluminum-doped zinc oxide, magnesium-indium oxide, cadmium-tin oxide, Au, Ag, Ni, Pd and Pt, and said second electrode is selected from the group of low work function materials consisting of Li, Na, K, Rb, Be, Mg, Ca, Sr, Ba, Yb, Sm, Al and alloys comprising said low work function materials.

11. Method according to claim 1 wherein a layer of dielectric material is disposed between said second electrode and said layer of organic material.

12. Method according to claim 11 wherein said layer of dielectric material is selected from the group consisting of oxides and fluorides of alkali metals and alkaline earth metals.

13. Method according to claim 1 wherein said substrate is selected from the group of materials consisting of glass, acrylic resins, polycarbonate resins, polyester resins, and polyethylene terephthalate resins.

14. Method according to claim 1 wherein said photoresponsive device comprises charge transporting and/or charge injecting layers.

15. Method according to claim 14 wherein said photoresponsive device comprises a hole transporting layer between said first electrode and said layer of organic material.

16. Method according to claim 15 wherein said photoresponsive device comprises a layer of PEDOT:PSS between said first electrode and said layer of organic material.

17. Photoresponsive device formed by the method of claim 1.

18. Photoresponsive device formed by the method of claim 1 wherein said device is a photovoltaic device.

19. Photoresponsive device formed by the method of claim 1 wherein said device is a photodetector and comprises external means for converting the current flowing across the device into a signal.

20. Method of increasing the power conversion efficiency and/or quantum yield of a photoresponsive device comprising a layer of organic material comprising a blend of at least two semiconductive polymers, said semiconductive polymers having different electron affinities and/or ionization potentials, said method comprising the steps of thermally annealing and encapsulating said photoresponsive device.

21. Method according to claim 1 further comprising encapsulating said photoresponsive device.

22. Method according to claim 1 wherein at least one of the electrodes is in direct contact with the layer of organic material.

23. Method according to claim 22 wherein the at least one electrode is a cathode.

24. Method according to claim 22 wherein the at least one electrode is an anode.

25. Method according to claim 20 wherein the encapsulation step is performed before the annealing step.

* * * * *